United States Patent [19]

Higashinakagawa et al.

[11] 4,283,439
[45] Aug. 11, 1981

[54] METHOD OF MANUFACTURING A SEMICONDUCTOR DEVICE BY FORMING A TUNGSTEN SILICIDE OR MOLYBDENUM SILICIDE ELECTRODE

[75] Inventors: Iwao Higashinakagawa; Syohei Sima, both of Kawasaki; Takahiko Moriya, Yokosuka, all of Japan

[73] Assignee: VLSI Technology Research Association, Japan

[21] Appl. No.: 144,836

[22] Filed: Apr. 29, 1980

Related U.S. Application Data

[63] Continuation of Ser. No. 971,547, Dec. 20, 1978, abandoned.

[30] Foreign Application Priority Data

Dec. 23, 1977 [JP]  Japan ................................. 52-155179

[51] Int. Cl.³ .......................................... H01L 21/285
[52] U.S. Cl. ...................................... 427/89; 156/653; 156/657; 204/192 SP; 357/67; 427/90; 427/91; 427/93; 427/94; 427/39
[58] Field of Search ....................... 427/88, 89, 94, 90, 427/93, 39; 357/67; 204/192 SP; 156/653, 657

[56] References Cited

U.S. PATENT DOCUMENTS

| | | | |
|---|---|---|---|
| 3,664,874 | 5/1972 | Epstein | 427/59 |
| 3,672,983 | 6/1972 | DeWitt et al. | 427/89 |
| 3,785,862 | 1/1974 | Grill | 427/89 |
| 3,833,842 | 9/1974 | Cunningham et al. | 357/67 |
| 4,026,742 | 5/1977 | Fujino | 427/88 |
| 4,128,670 | 12/1978 | Gaensslen | 427/88 |

FOREIGN PATENT DOCUMENTS 48-31030  9/1973  Japan ........................................ 427/94
48-31026  9/1973  Japan ........................................ 427/94

OTHER PUBLICATIONS

Shaw et al., "Vapor-Deposited Tungsten as a Metallization and Interconnection Material for Silicon Devices" RCA Review, Jun. 1970.
Eisenmann, "Deposition of Silicon Nitride," IBM TDB vol. 14, Jan. 1972.
Brown et al., "The P-Channel Refractory Metal Self-Registered MOSFET," IEEE Transactions on Electron Devices, vol. ED-18, No. 10, Oct. 1971, pp. 931-934.
Engeler et al., "Performance of Refractory Metal Multilevel Interconnection Systems," IEEE Transactions on Electron Devices, vol. ED-19, No. 1, Jan. 1972, pp. 54-56.

Primary Examiner—John D. Smith
Attorney, Agent, or Firm—Finnegan, Henderson, Farabow, Garrett & Dunner

[57] ABSTRACT

A method of manufacturing a semiconductor device comprises the steps of forming an interconnection electrode made of a refractory metal or a silicide of the metal on an insulating film formed on a semiconductor substrate with necessary elements already formed, forming a silicon nitride film on the interconnection electrode, and forming a silicon oxide film on the silicon nitride film, thereby preventing the elements from being deteriorated.

6 Claims, 4 Drawing Figures

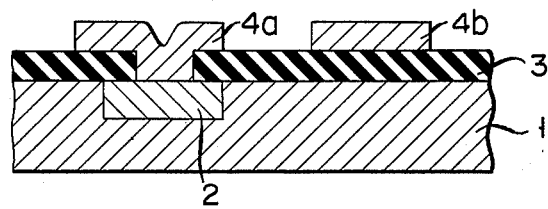
F I G. 1
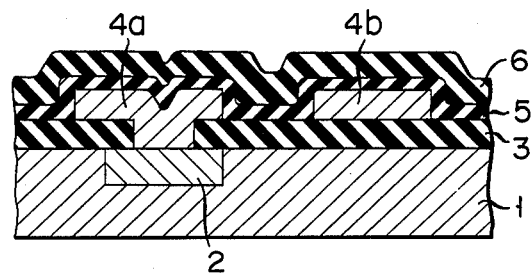
F I G. 2
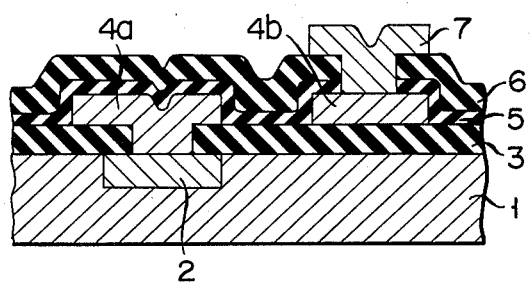
F I G. 3
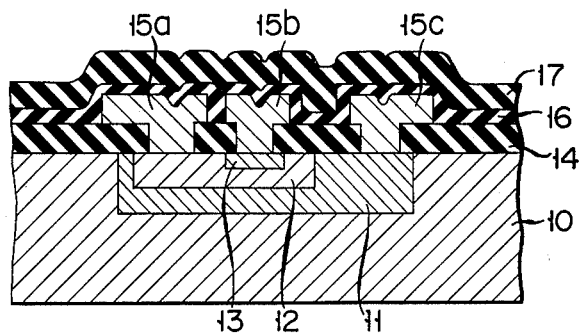
F I G. 4

METHOD OF MANUFACTURING A SEMICONDUCTOR DEVICE BY FORMING A TUNGSTEN SILICIDE OR MOLYBDENUM SILICIDE ELECTRODE

This is a continuation of application Ser. No. 971,547, filed Dec. 20, 1978 now abandoned.

BACKGROUND OF THE INVENTION

This invention relates to a method of manufacturing a semiconductor device which has an interconnection electrode made of a refractory metal or a silicide of the metal.

Generally the metallization material of a semiconductor device is made of aluminum, which has a good workability and which provides a good ohmic contact. The aluminum interconnection electrode, however, is likely to be cut by electromigration. This trouble is more likely to take place if the device has a high packing density and thus its interconnection electrode becomes fine to raise the current density of current flowing in the interconnection electrode. To avoid such trouble, the interconnection electrode may be made of a refractory metal such as molybdenum or a silicide of such a metal.

In manufacturing a semiconductor device, an insulating film is usually formed on an interconnection electrode to protect the wiring or to provide a multi-layer interconnection electrode structure. In most cases the insulating film is a silicon oxide film (including a PSG film and BSG film, each being an oxide layer containing impurities). To form the silicon oxide film on the interconnection electrode, the interconnection electrode is exposed to an oxidizing atmosphere of about 500° C. Thus, if the interconnection electrode is made of molybdenum, the molybdenum electrode will be oxidized during the process of forming a silicon oxide film, and the resultant oxide of molybdenum, which has an extremely high vapor pressure, will be sublimed to sputter and stick onto the constituent elements of the device, thereby deteriorating the electric characteristics of the elements.

SUMMARY OF THE INVENTION

An object of this invention is to provide a method of manufacturing a semiconductor device having an interconnection electrode made of a refractory metal or a silicide of such metal, wherein the characteristics of the constituent elements of the device are prevented from being deteriorated.

A method according to this invention comprises the steps of forming an interconnection electrode made of a refractory metal or a silicide of the metal on an insulating film formed on a semiconductor substrate with necessary elements already formed, forming a silicon nitride film on the interconnection electrode, and forming a silicon oxide film on the silicon nitride film.

BRIEF DESCRIPTION OF THE DRAWING

FIGS. 1, 2 and 3 show how a semiconductor device is manufactured by a method according to this invention; and FIG. 4 is a cross-sectional view of a bipolar transistor manufactured by the method according to this invention.

DETAILED DESCRIPTION OF THE PREFERRED EMBODIMENT

In the method according to this invention a silicon oxide film is formed on a silicon nitride film formed on an interconnection electrode made of a refractory metal or a silicide of the metal. Thus there is not formed a metal oxide having a high vapor pressure which might otherwise be formed if the silicon oxide film were formed directly on the interconnection electrode. Since such a metal oxide is not formed, the characteristics of the elements of a semiconductor device are not deteriorated.

The interconnection electrode used in this invention is not made of aluminum which has a low melting point. Instead, it is made of a metal having a high melting point or a silicide of the metal. For example, it is made of a metal having a melting point of 1500° C. or more such as molybdenum, tungsten, titanium, tantalum and niobium or a silicide of such metal. The method of this invention is effective, particularly when the oxide of such a metal has a high vapor pressure (e.g. sublimation point: about 1000° C.). It is therefore preferred that the interconnection electrode should be made of molybdenum, tungsten, silicide of molybdenum or silicide of tungsten.

With reference to the accompanying drawing, one embodiment of this invention will be described.

As shown in FIG. 1, a diffusion region 2 is formed in a semiconductor substrate 1. A silicon oxide film 3 is then deposited on the substrate 1 by the CVD method. Thereafter, a contact hole is made in the silicon oxide film 3. This done, an interconnection electrode made of a molybdenum film and having parts 4a and 4b is formed. The interconnection electrode is formed by sputtering, the CVD method or the electron beam deposition method. Its patterning may be achieved by plasma etching.

Thereafter, as shown in FIG. 2, a silicon nitride film 5 is deposited by, for example, the plasma CVD method at a low temperature from 200° to 350° C., e.g. about 300° C. until its thickness becomes 500 to 2000 Å, e.g. about 1000 Å. On the silicon nitride film 5 thus formed there is deposited by the ordinary CVD method a silicon oxide film 6 about 6000 Å thick. The silicon nitride film 5 is formed in an atmosphere consisting of ammonia gas, silane gas and an inert gas such as argon gas. The surface of the interconnection electrode is not therefore oxidized during the process of forming the silicon nitride film 5. The interconnection electrode undergoes substantially no reaction with ammonia gas since the plasma CVD method is carried at a temperature as low as about 300° C. Moreover, the interconnection electrode is never oxidized during the process of forming the silicon oxide film 6 since it is not exposed at all to the high-temperature oxidizing atmosphere.

Then, as illustrated in FIG. 3, the silicon oxide film 6 is selectively etched with ammonium fluoride. Using the etched film 6 as a mask, the silicon nitride film 5 is etched by plasma etching to produce a contact hole. An aluminum electrode 7 is formed partly in the contact hole of the silicon nitride film 5 and partly on the silicon oxide film 6. During the plasma etching of the silicon nitride film 5, the part 4b of the interconnection electrode is etched, too since it is made of a molybdenum film. But the plasma etching has good controllability and can be stopped when the part 4b is overetched to have its thickness reduced to, for example, 1000 Å or less. As a result, a good ohmic contact is provided between the part 4b of the interconnection electrode and the aluminum electrode 7.

As described above, it is possible with the method of this invention to prevent oxidation of an interconnection electrode made of a molybdenum film, which inevitably takes place in the known method while a silicon oxide film is being formed. Thus, the elements of a semiconductor device can be prevented from being contaminated while an oxide of molybdenum, which has a high vapor pressure, is being sputtered during the process of forming a silicon oxide film.

In the above-described embodiment the interconnection electrode is made of molybdenum. Instead, other metals having a high melting point such as tungsten may be effectively used in this invention to form an interconnection electrode since its oxide has a high vapor pressure. Further, a silicide of such metal, for example, molybdenum silicide may be used. Molybdenum silicide is considered to provide a stable silicon oxide on a semiconductor substrate in an oxidizing atmosphere. Thus, an oxide of molybdenum can be formed on the substrate in an oxidizing atmosphere. This means that the method according to this invention is effective also when the interconnection electrode is made of a metal silicide. A molybdenum silicide film may be formed in an atmosphere of an inert gas such as argon by sputtering or the CVD method at 600° to 700° C., using molybdenum chloride and silane for instance.

The method of this invention is employed when an interconnection electrode is made of a refractory metal, instead of aluminum. The method is therefore advantageous when applied to the manufacture of a semiconductor device such as a bipolar transistor, wherein a current of a high current density flows in the interconnection electrode.

FIG. 4 illustrates the cross section of a bipolar transistor manufactured by the method according to this invention. The bipolar transistor comprises a P-type semiconductor substrate 10, an N-type collector region 11, a P-type base region 12, an N-type emitter region 13, a silicon oxide film 14, an interconnection electrode including parts 15a, 15b and 15c made of molybdenum, a silicon nitride film 16 and a silicon oxide film 17. The silicon nitride film 16 prevents the molybdenum interconnection electrode from being oxidized while the silicon oxide film is being formed.

What we claim is:

1. A method of making a semiconductor device comprising the steps of:
    forming an interconnection electrode comprising a silicide of a refractory metal selected from the group consisting of molybdenum and tungsten on an insulating film formed on a semiconductor substrate;
    forming a silicon nitride film on the interconnection electrode in an atmosphere containing ammonia gas and silane gas;
    forming a silicon oxide film on the silicon nitride film;
    selectively etching the silicon oxide film and the silicon nitride film to form a contact hole; and
    forming a metal electrode layer on the silicon oxide film and the interconnection electrode through said contact hole.

2. A method of making a semiconductor device comprising of the steps of:
    forming an interconnection electrode comprising a silicide of a refractory metal selected from the group consisting of molybdenum and tungsten by sputtering or chemical vapor deposition on an insulating film formed on a semiconductor substrate;
    forming a silicon nitride film on the interconnection electrode in an atmosphere containing ammonia gas and silane gas;
    forming a silicon oxide film on the silicon nitride film;
    selectively etching the silicon oxide film and the silicon nitride film to form a contact hole; and
    forming a metal electrode layer on the silicon oxide film and the interconnection electrode through said contact hole.

3. A method according to claim 1 or 2, wherein said step of forming a silicon nitride film is carried out by the plasma CVD method.

4. A method according to claim 3, wherein the plasma CVD method is carried out at 200° to 350° C. in an atmosphere consisting of ammonia, silane and an inert gas.

5. A method according to claim 4, wherein said silicon nitride film is formed 500 to 2000 Å thick.

6. A method according to claim 1 or 2, wherein said semiconductor device is a bipolar transistor.

* * * * *